United States Patent
Fujimoto et al.

(10) Patent No.: US 8,835,954 B2
(45) Date of Patent: Sep. 16, 2014

(54) SEMICONDUCTOR LIGHT EMITTING DEVICE AND METHOD FOR MANUFACTURING THE SAME

(75) Inventors: Akira Fujimoto, Kanagawa-ken (JP); Ryota Kitagawa, Tokyo (JP); Kumi Masunaga, Kanagawa-ken (JP); Kenji Nakamura, Kanagawa-ken (JP); Tsutomu Nakanishi, Tokyo (JP); Koji Asakawa, Kanagawa-ken (JP); Takanobu Kamakura, Fukuoka-ken (JP); Shinji Nunotani, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 18 days.

(21) Appl. No.: 13/221,326

(22) Filed: Aug. 30, 2011

(65) Prior Publication Data

US 2012/0228654 A1 Sep. 13, 2012

(30) Foreign Application Priority Data

Mar. 8, 2011 (JP) .................. 2011-050248

(51) Int. Cl.
*H01L 33/60* (2010.01)
*H01L 33/40* (2010.01)
*H01L 33/38* (2010.01)
*H01L 33/00* (2010.01)

(52) U.S. Cl.
CPC .............. *H01L 33/38* (2013.01); *H01L 33/40* (2013.01); *H01L 33/405* (2013.01); *H01L 2933/0016* (2013.01); *H01L 33/0079* (2013.01)
USPC .................. 257/98; 257/13; 257/79; 257/81; 257/97

(58) Field of Classification Search
USPC .............. 257/13, 79, 81, 97, 98, 99, 103
See application file for complete search history.

(56) References Cited

U.S. PATENT DOCUMENTS 5,345,092 A * 9/1994 Kurihara .................. 257/13
6,258,618 B1 * 7/2001 Lester .................... 438/46

(Continued)

FOREIGN PATENT DOCUMENTS

JP  63-84084 A   4/1988
JP  9-186365     7/1997

(Continued)

OTHER PUBLICATIONS

U.S. Appl. No. 13/221,319, filed Aug. 30, 2011, Masunaga, et al.

(Continued)

*Primary Examiner* — Julio J Maldonado
*Assistant Examiner* — Jaehwan Oh
(74) *Attorney, Agent, or Firm* — Oblon, Spivak, McClelland, Maier & Neustadt, L.L.P.

(57) ABSTRACT

According to one embodiment, a semiconductor light emitting device includes a structure including a first semiconductor layer of a first conductivity type, a second semiconductor layer of a second conductivity type and a light emitting layer provided between the first semiconductor layer and the second semiconductor layer. The device also includes an electrode layer provided on the second semiconductor layer side of the structure. The electrode layer includes a metal portion with a thickness of not less than 10 nanometers and not more than 100 nanometers. A plurality of openings pierces the metal portion, each of the openings having an equivalent circle diameter of not less than 10 nanometers and not more than 5 micrometers. The device includes an inorganic film providing on the metal portion and inner surfaces of the openings, the inorganic film having transmittivity with respect to light emitted from the light emitting layer.

12 Claims, 10 Drawing Sheets

(56) References Cited

U.S. PATENT DOCUMENTS

| | | | |
|---|---|---|---|
| 6,998,649 B2* | 2/2006 | Hata | 257/99 |
| 7,057,212 B2* | 6/2006 | Kim et al. | 257/98 |
| 7,202,504 B2* | 4/2007 | Ikeda et al. | 257/79 |
| 7,279,718 B2* | 10/2007 | Krames et al. | 257/98 |
| 7,446,336 B2* | 11/2008 | Yamazaki et al. | 257/59 |
| 7,485,479 B2* | 2/2009 | Seong et al. | 438/25 |
| 7,485,897 B2* | 2/2009 | Seong et al. | 257/81 |
| 7,538,360 B2* | 5/2009 | Fudeta et al. | 257/99 |
| 7,569,863 B2* | 8/2009 | Ueda | 257/97 |
| 7,696,524 B2* | 4/2010 | Ikeda et al. | 257/98 |
| 7,737,449 B2* | 6/2010 | Yamazaki et al. | 257/72 |
| 7,745,019 B2* | 6/2010 | Nomura et al. | 428/690 |
| 7,812,355 B2* | 10/2010 | Shiroguchi et al. | 257/79 |
| 7,856,040 B2* | 12/2010 | Bour et al. | 372/43.01 |
| 7,960,733 B2* | 6/2011 | Yamazaki et al. | 257/59 |
| 8,101,964 B2* | 1/2012 | Kitagawa et al. | 257/99 |
| 8,330,356 B2* | 12/2012 | Jeong et al. | 313/504 |
| 8,476,670 B2* | 7/2013 | Kim et al. | 257/103 |
| 2003/0141507 A1* | 7/2003 | Krames et al. | 257/79 |
| 2004/0241494 A1* | 12/2004 | Takasu et al. | 428/690 |
| 2004/0245541 A1* | 12/2004 | Shitagaki et al. | 257/103 |
| 2005/0062057 A1* | 3/2005 | Yamazaki et al. | 257/98 |
| 2005/0156185 A1* | 7/2005 | Kim et al. | 257/99 |
| 2005/0184299 A1* | 8/2005 | Matsumura et al. | 257/79 |
| 2005/0184305 A1* | 8/2005 | Ueda | 257/99 |
| 2005/0249974 A1* | 11/2005 | Mori et al. | 428/690 |
| 2005/0263775 A1* | 12/2005 | Ikeda et al. | 257/79 |
| 2006/0071226 A1* | 4/2006 | Kojima et al. | 257/98 |
| 2006/0097278 A1* | 5/2006 | Goto et al. | 257/103 |
| 2007/0155032 A1* | 7/2007 | Kim et al. | 438/22 |
| 2007/0200122 A1* | 8/2007 | Kim et al. | 257/79 |
| 2007/0205423 A1* | 9/2007 | Yamazaki et al. | 257/89 |
| 2009/0079322 A1* | 3/2009 | Tsutsumi et al. | 313/349 |
| 2009/0134401 A1* | 5/2009 | Maekawa | 257/72 |
| 2009/0152585 A1* | 6/2009 | Shinohara et al. | 257/103 |
| 2009/0242925 A1* | 10/2009 | Kitagawa et al. | 257/99 |
| 2009/0261372 A1* | 10/2009 | Ueda | 257/98 |
| 2009/0309093 A1* | 12/2009 | Iwaki et al. | 257/40 |
| 2010/0051973 A1* | 3/2010 | Kobayashi et al. | 257/88 |
| 2010/0074292 A1* | 3/2010 | Bour et al. | 372/45.011 |
| 2010/0148204 A1* | 6/2010 | Ikeda et al. | 257/98 |
| 2011/0163339 A1* | 7/2011 | Negishi et al. | 257/98 |

FOREIGN PATENT DOCUMENTS

| | | |
|---|---|---|
| JP | 10-256602 A | 9/1998 |
| JP | 11-220171 | 8/1999 |
| JP | 2000-294837 | 10/2000 |
| JP | 2001-148511 A | 5/2001 |
| JP | 2002-335014 A | 11/2002 |
| JP | 2003-168823 | 6/2003 |
| JP | 2004-119839 A | 4/2004 |
| JP | 2004-277780 | 10/2004 |
| JP | 2005-39264 A | 2/2005 |
| JP | 2005-108982 | 4/2005 |
| JP | 2005-203618 | 7/2005 |
| JP | 2007-80899 | 3/2007 |
| JP | 2007-123446 A | 5/2007 |
| JP | 2007-184411 | 7/2007 |
| JP | 2007-273746 A | 10/2007 |
| JP | 2008-218878 A | 9/2008 |
| JP | 2009-231689 A | 10/2009 |
| JP | 2010-267694 | 11/2010 |
| JP | 2011-35017 A | 2/2011 |
| WO | WO 03/007390 A1 | 1/2003 |
| WO | WO 2007/015330 A1 | 2/2007 |

OTHER PUBLICATIONS

Office Action issued Sep. 10, 2013 in Japanese Application No. 2011-050248 (With English Translation).

Japanese Office Action Issued Apr. 5, 2013 in Patent Application No. 2011-050248 (with English translation).

* cited by examiner

SEMICONDUCTOR LIGHT EMITTING DEVICE AND METHOD FOR MANUFACTURING THE SAME

CROSS-REFERENCE TO RELATED APPLICATION

This application is based upon and claims the benefit of priority from the prior Japanese Patent Application No. 2011-50248, filed on Mar. 8, 2011; the entire contents of which are incorporated herein by reference.

FIELD

Embodiments described herein relate generally to a semiconductor light emitting device and a method for manufacturing the same.

BACKGROUND

A semiconductor light emitting device emits light, while current flows via electrodes provided on a top surface of a semiconductor layer. There are some semiconductor light emitting devices having a metal electrode layer provided on a light emitting surface and nanometer (nm) scale, fine openings formed in the metal electrode layer. A practical configuration for obtaining high levels of brightness is desired.

DETAILED DESCRIPTION

Figure 1:
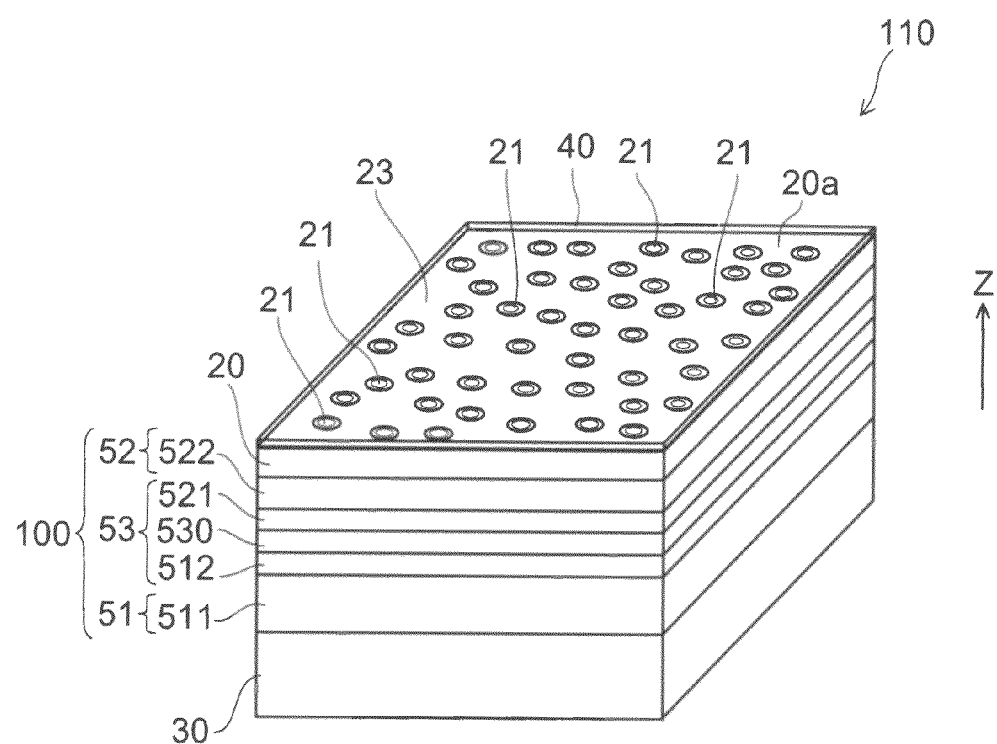
FIG. 1 is a schematic perspective view illustrating a semiconductor light emitting device according to an embodiment.

In general, according to one embodiment, a semiconductor light emitting device includes a structure including a first semiconductor layer of a first conductivity type, a second semiconductor layer of a second conductivity type and a light emitting layer provided between the first semiconductor layer and the second semiconductor layer. The device also includes an electrode layer provided on the second semiconductor layer side of the structure, the electrode layer including a metal portion with a thickness of not less than 10 nanometers and not more than 100 nanometers along a direction from the first semiconductor layer toward the second semiconductor layer. A plurality of openings pierce the metal portion along the direction, each of the openings viewed in the direction having an equivalent circle diameter of not less than 10 nanometers and not more than 5 micrometers. Further, the device includes an inorganic film provided on the metal portion and inner surfaces of the openings, the inorganic film having transmittivity with respect to light emitted from the light emitting layer.

A method for manufacturing a semiconductor light emitting device includes forming a structure on a substrate, the structure including a first semiconductor layer of a first conductivity type, a second semiconductor layer of a second conductivity type and a light emitting layer provided between the first semiconductor layer and the second semiconductor layer. The method includes forming, on the second semiconductor layer, a metal layer with a thickness of not less than 10 nanometers and not more than 100 nanometers along a direction from the first semiconductor layer toward the second semiconductor layer. The method also includes forming a mask pattern on the metal layer and forming a plurality of openings in the metal layer using the mask pattern as an etching mask, each of the openings having an equivalent circle diameter, when viewed in the direction, of not less than 10 nanometers and not more than 5 micrometers. Further, the method includes forming an inorganic film covering the metal layer and inner surfaces of the openings, the inorganic film having transmittivity with respect to the light emitted from the light emitting layer.

Embodiments of the invention will now be described with reference to the drawings.

Note that the drawings are schematic or conceptual in nature, and relationships between thicknesses and widths of each portion, ratios between sizes of portions and the like are not therefore necessarily identical to the actual relationships and ratios. Also, even where identical portions are depicted, dimensions and ratios may appear differently depending on the drawing.

Further, in the drawings and specification of this application, the same numerals are applied to elements that have already appeared in the drawings and been described, and repetitious detailed descriptions of such elements are omitted.

Also, in the following explanation, examples are given wherein a first conductivity type is n-type, and a second conductivity type is p-type.

First Embodiment

FIG. 1 is a schematic perspective view illustrating a configuration of a semiconductor light emitting device according to a first embodiment.

Figure 2:
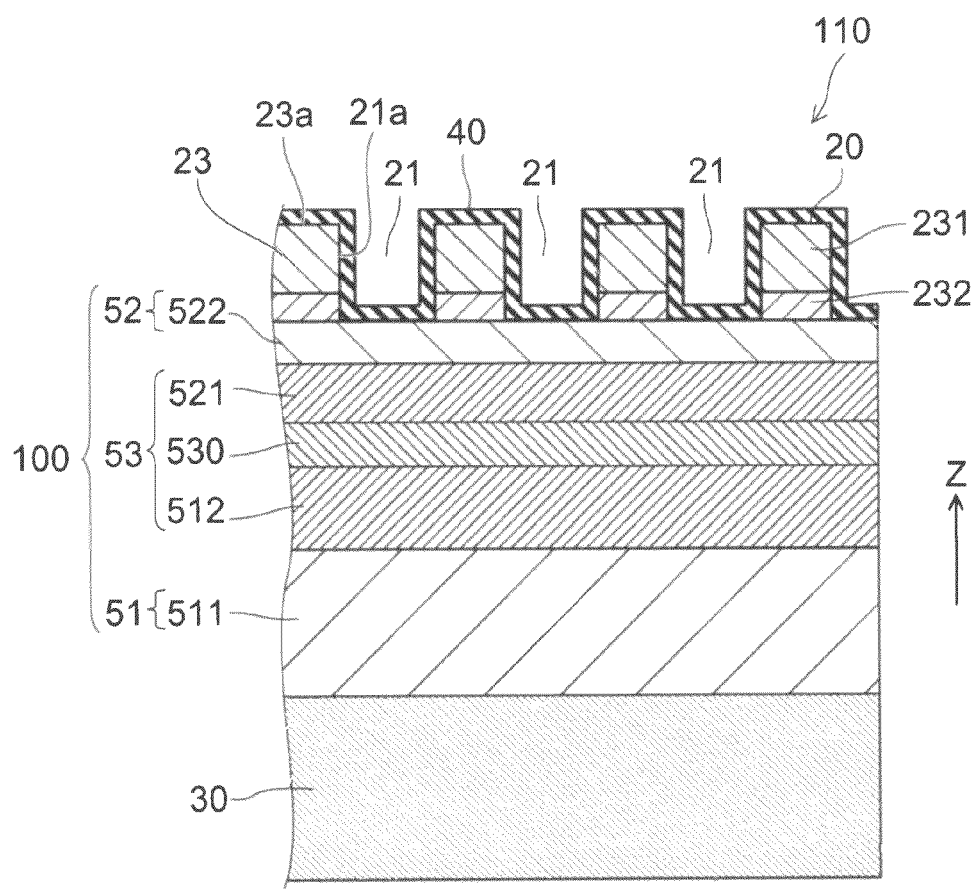
FIG. 2 is a partial schematic cross-sectional view illustrating a semiconductor light emitting device according to the embodiment.

FIG. 2 is a partial schematic cross-sectional view of a semiconductor light emitting device according to the first embodiment.

A semiconductor light emitting device 110 according to the first embodiment includes a structure 100, a second electrode layer 20 and an inorganic film 40.

The structure 100 includes a first semiconductor layer 51 of a first conductivity type, a second semiconductor layer of a second conductivity type, and an active layer 53 provided between the first semiconductor layer 51 and the second semiconductor layer 52. The structure 100 is, for example, formed using nitride semiconductors.

Here, in this specification, the term, "nitride semiconductor" includes semiconductors of all compositions wherein composition ratios of x, y, and z in the formula $In_xAl_yGa_{1-x-y}N$ (where $0 \leq x \leq 1$, $0 \leq y \leq 1$, and $x+y \leq 1$) or $B_xIn_yAl_zGa_{1-x-y-z}N$ fall within the respective ranges of $0 \leq x \leq 1$, $0 \leq y \leq 1$, $0 \leq z \leq 1$, and $x+y+z \leq 1$. Furthermore, for the formulae described above, "nitride semiconductors" shall also be understood to include semiconductors further including group V elements other than N (nitrogen), semiconductors further including various elements added to control physical properties such as conductivity type and the like, and semiconductors further including various unintentionally elements.

The first semiconductor layer 51 includes, for example, a current spreading layer 511 of n-type GaN.

The second semiconductor layer 52 includes a current spreading layer 522. Specifically, the current spreading layer 522 formed from, for example, p-type GaN is provided on a cladding layer 521 formed from, for example, p-type GaN. In the embodiment, for reasons of convenience, the current spreading layer 522 is included in the second semiconductor layer 52.

The active layer 53 is provided between the first semiconductor layer 51 and the second semiconductor layer 52. In the semiconductor light emitting device 110, the active layer 53 is, for example, configured by the cladding layer 512 made from n-type GaN, a light emitting layer 530 and a cladding layer 521 formed from p-type GaN.

The first semiconductor layer 51, the active layer 53 and the second semiconductor layer 52 included in the structure 100 are provided by an epitaxial crystal growth on a substrate (such as a sapphire substrate) not illustrated in the drawings.

The second electrode layer 20 is provided on the second semiconductor layer 52 side of the structure 100. Specifically, the second electrode layer 20 is provided on a side of the second semiconductor layer 52 opposite to the first semiconductor layer 51. The second electrode layer 20 contains, for example, an Ag (silver) compound, as described later.

In this embodiment, for convenience of explanation, the second semiconductor layer 52 side of the structure 100 is defined as a top surface side or top side, and the first semiconductor layer 51 side of the structure 100 is defined as a back surface side or bottom side. Also, a direction from the first semiconductor layer 51 toward the second semiconductor layer 52 along a stacking direction is defined as a "Z-axis direction".

The second electrode layer 20 includes a metal portion 23 with a plurality of openings 21. The openings 21 pierce through the metal portion 23 along the Z direction. An equivalent circle diameter of the openings 21 when viewed in the Z direction is not less than 10 nm and not more than 5 μm. Preferably, the equivalent circle diameter is not less than 10 nm and less than 1 μm, more preferably not less than 10 nm and less than 500 nm and even more preferably not less than 10 nm and less than 50 nm.

Here, the equivalent circle diameter is defined by the following equation.

$$\text{Equivalent circle diameter} = 2 \times (\text{Area}/\pi)^{1/2}$$

Here, "Area" is the area of the openings 21 when viewed in the Z direction.

The openings 21 are not necessarily circular in shape. Thus, in the embodiment, the openings 21 are specified using the equivalent circle diameter definition described above.

The semiconductor light emitting device 110 includes a first electrode layer 30. The first electrode layer 30 is provided on the first semiconductor layer 51 side of the structure 100. Specifically, the first electrode layer 30 is provided on the side of the first semiconductor layer 51 opposite to the second semiconductor layer 52. The first electrode layer 30 is made of metal. The first electrode layer 30 includes a portion that contacts a back surface side of the first semiconductor layer 51, and this portion provides electrical continuity with the first semiconductor layer 51. The first electrode layer may contain, for example, Ag. The first electrode layer 30 is formed using, for example, a vacuum deposition method.

The inorganic film 40 is formed to cover a top surface of the metal portion 23 and inner surfaces of the openings 21 of the second electrode layer 20. Specifically, as illustrated in FIG. 2, the inorganic film 40 is provided so as to cover inner wall surfaces 21a of the openings 21 and a top surface 23a at the top side of the metal portion 23.

The inorganic film 40 has transmissivity with respect to light emitted from the light emitting layer 530. A thickness of the inorganic film 40 is, for example, not less than 20 nm and not more than 200 nm.

In the semiconductor light emitting device 110, a top surface side on which the second electrode layer 20 is formed is used as a main light emitting face. In other words, by applying a predetermined voltage between the second electrode layer 20 and the first electrode layer 30, light having a predetermined central wavelength is emitted from the light emitting layer 530. The light is mainly extracted to the outside from a major surface 20a of the second electrode layer 20.

In the semiconductor light emitting device 110 according to the first embodiment, the openings 21 are provided in the second electrode layer 20, and light can therefore be efficiently emitted to the outside while current expansion to the light emitting layer 530 is maintained by the second electrode layer 20. Here, the second electrode layer 20 includes the fine openings 21, which, for example, have sizes approximating to not less than 10 nm and not more than 5 μm.

Further, in the semiconductor light emitting device 110, the second electrode layer 20 and the first electrode layer 30 are arranged to oppose to each other and metal is used as the first electrode layer 30. Hence, current spreads in the second electrode layer 20 and flows from the light emitting layer 530 toward the first electrode layer 30, thereby current concentrations can be suppressed in light emitting layer 530 viewed in the Z-axis direction.

Moreover, in the semiconductor light emitting device 110, the Ag compound can be protected by the inorganic film 40. Specifically, since the top surface of the metal portion 23 and the inner surfaces of the openings 21 are covered by the inorganic film 40, the Ag compound can be protected from the annealing temperature when annealing is carried out to ensure the ohmic contact of the second electrode layer 20. As a result, it is possible to improve the brightness of the light emitted from the second electrode layer 20 that uses the Ag compound.

An example of the semiconductor light emitting device 110 is explained below.

The semiconductor light emitting device 110 includes, for example, a current spreading layer 511 of n-type GaN. A heterostructure including the cladding layer 512 made, for example, from n-type GaN doped with Si, the light emitting layer 530 made from InGaN, and a cladding layer 521 made from p-type AlGaN are formed on the current spreading layer 511.

The light emitting layer 530 may be a Multiple Quantum Well (MQW) configuration with, for example, repeatedly alternating barrier layers (GaN) and well layers (InGaN). Alternatively, the light emitting layer 530 may include a Single Quantum Well (SQW) configuration provided with a combination of a single well layer sandwiched by barrier layers.

The current spreading layer 522 made, for example, from p-type GaN is formed on the light emitting layer 530. The current spreading layer 522 may be doped with Mg or the like. In this way, a resistance value of the current spreading layer 522 is decreased, making it easier for an ohmic contact to be formed with the second electrode layer 20. Note that the configuration of these semiconductor layers is an example, and the embodiment is not limited to this configuration.

A contact layer may, for example, be formed on the current spreading layer 522, and the second electrode layer 20 may be formed on the current spreading layer 522 via the contact layer.

The material used for the contact layer may be appropriately selected based on the materials used in the current spreading layer 522, which is adjacent to the contact layer, and the material used in the second electrode layer 20.

The metal portion 23 of the second electrode layer 20 includes a first layer 231 containing the Ag compound and a second layer 232 provided between the first layer 231 and the second semiconductor layer 52.

The first layer 231 contains, for example, at least one element selected from the group consisting of Al, Cu, Zn, Zr, Si, Ge, Pt, Rh, Ni, Pd, Cu, Sn, C, Mg, Cr, Te, Se, In, Co and Ti.

The second layer 232 contains at least one of Ni, Ti, Cr, and Co. A thickness of the second layer 232 along the Z-axis direction is, for example, not less than 1 nm and not more than 5 nm.

Thus, by providing the second layer 232 between the first layer 231 and the second semiconductor layer 52, the Ag contained in the first layer 231 is prevented from diffusing into the second semiconductor layer 52. Note, that if the film thickness of the second layer 232 is too large, the transmittivity for light emitted from the light emitting layer 530 may be reduced. For this reason, a thickness of the second layer 232 is preferably not more than 5 nm.

In this example, the first layer 231 containing Ag—Pd—Cu and the second layer 232 containing an Ni compound are included in the second electrode layer 20 that forms the p-side electrode. Thus, the second electrode layer 20 includes the layer structure of Ni/Ag—Pd—Cu. The thickness of the first layer 231 along the Z-axis direction is, for example 40 nm.

Further, in this example, the thickness of the second electrode layer 20 along the Z-axis direction is not less than 10 nm and not more than 100 nm. Preferably, the thickness is not less than 10 nm and not more than 50 nm.

A plurality of the openings 21 is provided in the second electrode layer 20, piercing the metal portion 23 along the Z-axis direction. Sizes and positions of the openings 21 respectively may be regular or irregular.

The top surface of the metal portion 23 and the inner surfaces of the openings 21 are covered by the inorganic film 40. The inorganic film 40 is provided so as to cover at least exposed portions of a first layer 231. The inorganic film 40 contains, for example, one material selected from among SiN, BN, AlN, GaN, CN, ZnS, AlF$_3$, MgF$_2$, CaF$_2$, CeF$_2$, GdF$_2$, LaF$_2$, NdF$_2$, LiF, NaF, YbF$_3$ and YF$_3$. In this example, the inorganic film 40 contains SiN.

Here, the inorganic film 40 is preferably a film that does not contain oxygen as a main component. Among the selectable inorganic films 40, SiN has favorable film-forming properties and is easy to process after film formation.

A thickness of the inorganic film 40 (thicknesses along directions perpendicular to the top surface of the metal portion 23 and the inner surface of the opening 21 respectively) is, for example, not less than 20 nm and not more than 200 nm. If the thickness of the inorganic film 40 is less than 20 nm, sufficient heat-resistance cannot be obtained for the Ag compound contained in the metal portion 23. On the other hand, if the thickness of the inorganic film 40 is greater than 200 nm, cracking may occur.

On the back surface side of the current spreading layer 511, the first electrode layer 30 is formed, for example, from Ag.

The first electrode layer 30 includes a portion that contacts the first semiconductor layer 51, and the portion provides electrical continuity with the first semiconductor layer 51. A thickness along the Z-axis direction of the first electrode layer 30 is preferably not less than 1 μm. Specifically, the structure 100 is formed by epitaxial layers grown on a substrate and a thickness along the Z-axis direction is extremely thin. Hence, after the substrate is separated from the structure 100, the first electrode layer 30 formed on the back surface side of the structure 100 serves to strengthen the structure 100. Hence, by setting the thickness of the first electrode layer 30 to not less than 1 μm, the structure 100 can be sufficiently reinforced.

Here, the thickness of the structure 100 along the Z-axis direction is not less than several μm and not more than 20 μm. The thickness of the first electrode layer 30 along the Z direction is preferably not less than 1 μm and not more than 500 μm, and more preferably not less than 10 μm and not more than 100 μm.

In the embodiment, the second electrode layer 20 and the first electrode layer 30 oppose each other across the structure 100.

Also, in the semiconductor light emitting device 110 according to the embodiment, light emitted from the light emitting layer 530 is extracted to the outside from whole surfaces of the second semiconductor layer 52 via the second electrode layer 20. The semiconductor light emitting device 110 emits light with, for example, a central wavelength of not less than 400 nm and not more than 650 nm.

When, in the semiconductor light emitting device 110 that emits light of such a wavelength, a material containing the Ag compound is used in the second electrode layer 20, absorption of the light is suppressed, thereby enabling an enhancement in luminous efficiency.

However, the inventors discovered a new problem in that when the Ag compound is used as the second electrode layer 20 having the openings 21, the annealing used to ensure an ohmic contact with the second electrode layer 20 causes condensation of Ag.

FIGS. 3A, 3B and FIGS. 4A and 4B are images showing states of the second electrode layer before and after annealing.

Figure 3A:
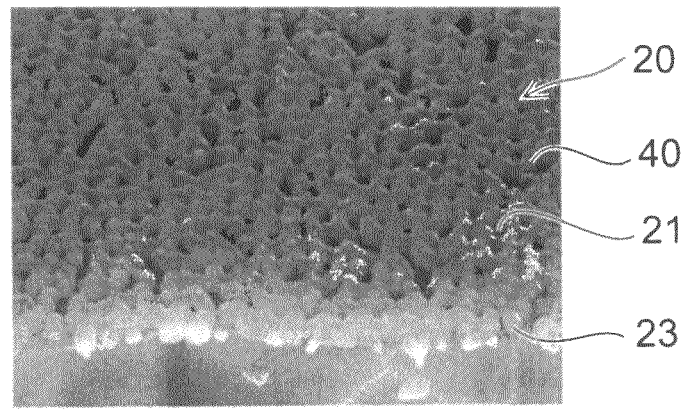
FIG. 3A is a image showing an electrode layer before annealing and FIG. 3B is a image showing the electrode layer after annealing, where an inorganic film is provided thereon.
Figure 3B:
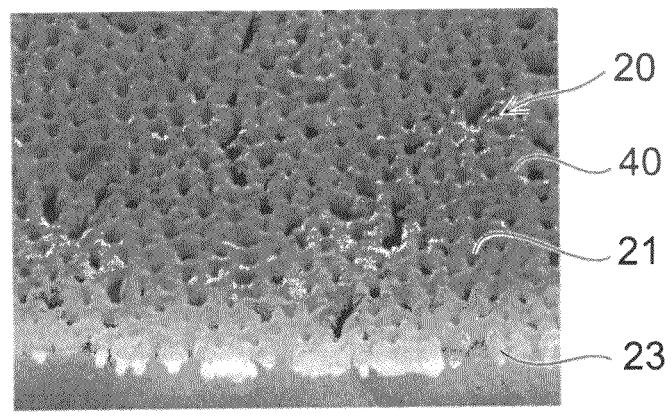
Figure 4A:
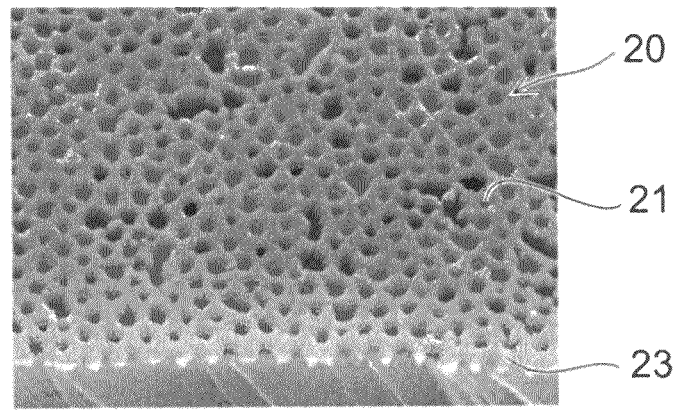
FIG. 4A is a image showing an electrode before annealing and FIG. 4B is a image showing the electrode layer after annealing, where the inorganic film is not provided thereon.
Figure 4B:
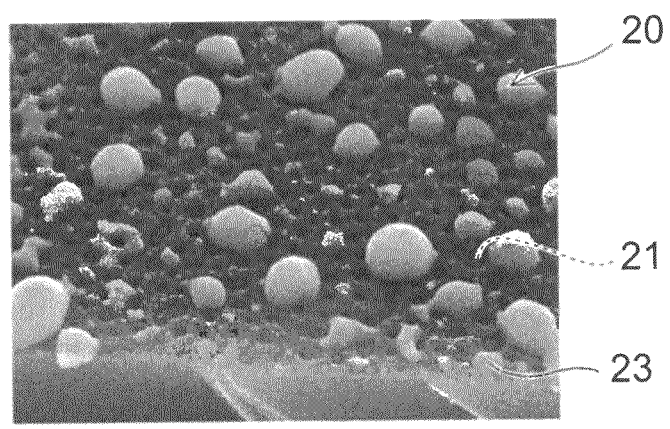

FIGS. 3A and 3B show the case in which an inorganic film is provided and FIGS. 4A and 4B show the case in which no such inorganic film is provided. Each shows before annealing A and after annealing B.

In the example shown in FIG. 3A, the openings 21 are formed at a distance of 150 nm therebetween in the second electrode layer 20 of the Ni/Ag—Cu—Pd layer structure, and the SiN inorganic film 40 is provided thereon. FIG. 3B shows a state of the second electrode layer 20 provided with the inorganic film 40 after annealing at 650° C. It can be see that the openings 21 provided in the second electrode layer 20 are maintained in a substantially unchanged state.

In the example shown in FIG. 4A, the openings 21 are formed at a distance of 150 nm therebetween in the second electrode layer 20 of the Ni/Ag—Cu—Pd layer structure. The inorganic film 40 is not provided on the second electrode layer 20. FIG. 4B shows a state of the second electrode layer 20 after annealing at 650° C. It can be seen that after the annealing, the Ag contained in the second electrode layer 20 has condensed, and the openings 21 cannot be maintained.

It is considered that in an Ag—Cu—Pd alloy, condensation may occur at temperatures of 500° C. or higher.

For example, in a semiconductor light emitting device 110 that emits blue or green light, use of a material containing the Ag compound in the second electrode layer 20 suppresses the absorption of light, enabling an enhancement in the luminous efficiency. However, when the thickness of the metal portion is not less than 10 nm and not more than 100 nm and the material containing the Ag compound is used in the second electrode layer 20 with the openings 21 having an equivalent circle diameter of not less than 10 nm and not more than 5 µm, the above described annealing at 500° C. or higher causes condensation of the Ag, and the openings 21 cannot be maintained. For this reason, the practical application of this configuration is difficult.

Based on the results of the above-described experiments, the inventors discovered that, by providing the inorganic film 40 on the second electrode layer 20, it was possible to maintain the openings 21 even when the material containing the Ag compound was used in the second electrode layer 20. In other words, the inventors discovered how to ensure sufficient heat endurance when annealing the second electrode layer 20. The inventors confirmed that when SiN was used as the inorganic film 40, the openings 21 in the second electrode layer 20 could be maintained up to a temperature of approximately 700° C.

Note also that if the equivalent circle diameter of the openings 21 is less than 10 nm, the inorganic film 40 does not provide a sufficient enhancement in heat endurance. On the other hand, if the equivalent circle diameter of the openings 21 is larger than 5 µm, condensation of the Ag contained in the second electrode layer 20 is caused by annealing at temperatures of 500° C. or higher.

Thus, when the equivalent circle diameter of the openings 21 is not less than 10 nm and not more than 5 µm, the inorganic film 40 provides a sufficient enhancement in heat endurance. In other words, the openings 21 can be maintained without causing condensation of Ag contained in the second electrode layer 20, even when annealing is performed at a temperature of 500° C. or higher.

As a result, a satisfactory ohmic contact and optical reflection characteristics can be obtained for the second electrode layer 20 even when the Ag compound is used in the second electrode layer 20, and it is possible to enhance, for example, the luminous efficiency of a semiconductor light emitting device 110 that emits blue or green light.

As described above, in the semiconductor light emitting device 110 according to the embodiment, the equivalent circle diameter of the openings 21 in the second electrode layer 20 is not less than 10 nm and not more than 5 µm. Further, the thickness of the second electrode layer 20 is not less than 10 nm and not more than 100 nm.

In other words, in the semiconductor light emitting device 110, temperature rise of the semiconductor light emitting device 110 is suppressed by obtaining a high heat dissipation through provision of a relatively large second electrode layer 20. Further, temperature rise of the semiconductor light emitting device 110 is suppressed by adjusting the size (for example the equivalent circle diameter) of the openings 21 provided in the second electrode layer 20. Furthermore, a forward direction voltage of the semiconductor light emitting device 110 can be lowered by reducing a series resistance, thereby the heat generation itself can be reduced.

In order to realize this effect, it is sufficient that the current flow uniformly over the entire face of the second semiconductor layer 52 from the second electrode layer 20 having the openings 21. In order that the current can flow uniformly to the second semiconductor layer 52, sizes of the openings 21 and distances between the centers of the openings 21 are limited to a certain extent.

Although this depends on the doping concentration and the like in the semiconductors in which current flows, the range of diameters over which the current will flow in the openings 21 from the edge of the second electrode layer 20, as obtained using calculations in simulations and the like, reaches up to approximately 5 µm, and the range of diameters for which there is sufficient conductivity and no rise in forward direction current is reaches not more than 1 µm. In other words, if the diameter of the openings is not less than 5 µm, there will be a region in the opening 21 where current does not flow and it will not be possible to lower the series resistance or, it follows, the forward direction voltage. Hence, an upper limit on the average opening diameter of the openings 21 is not more than 5 µm.

By providing the openings 21 with diameters significantly smaller than the wavelength of the light emitted from the light emitting layer 530, the second electrode layer 20 can be made to function as a light-transmitting electrode despite being made of metal. The reason for this is that linear distances of continuous metal portions unimpeded by the openings are significantly shorter than the wavelength of the light. Hence, when the second electrode 20 is irradiated with light, the motion of free electrons excited by the electric field of the light is impeded, preventing light of such wavelengths being reflected and thus making the metal transparent.

According to Drude's theory, which describes reflection by metals, a target material is assumed to have a uniform structure that is sufficiently large relative to the wavelength of the light that is irradiating it. When a substance is irradiated with light having a frequency that is lower than a plasma frequency, the free electrons within the substance are polarized by the electric field of the light. This polarization is induced in a direction to cancel out the electric field of the light. As a result of the cancelling of the electric field of the light by the induced polarization of the electrons, the light is prevented from passing through the substance, and a so-called plasma reflection occurs. Here, it is considered that if the substance in which polarization of the electrons is induced is sufficiently small relative to the wavelength of light, motion of the electrons is restricted by geometric structure and cancelling of the electric field of the light is not possible. Structurally, this effect can be achieved by making the diameter of the openings sufficiently small relative to the wavelength of the light in question.

Hence, to obtain the effect whereby a light transmittance in the second electrode layer 20 (transmittance of light generated by the light emitting layer 530 to the outside) exceeds the value normally expected for the opening ratio (area of openings with respect to area of second electrode layer 20), the equivalent circle diameter is preferably not more than approximately ½ of the central wavelength of the light. For example, in the case of visible light, the equivalent circle diameter of the openings 21 may be not more than 300 nm.

The lower limit for the equivalent circle diameter of the openings 21 is not limited from the point of view of resistance value, but for ease of manufacture it may be not less than 10 nm and preferably not less than 30 nm.

Note also that, for example, the metal portion 23 between an arbitrary two points in the second electrode layer 20 (the part where the openings 21 are not provided) is continuous without discontinuity, and the points are electrically connected to a current supply source such as the pad electrode. This is to maintain a low resistance value to ensure electrical continuity.

Also, where a plurality of current supply sources are provided, it is sufficient that the metal portion 23 of the second electrode layer 20 be continuous in correspondence with the respective the current supply sources.

Moreover, the metal portion 23 is preferably continuous. In this way, uniformity of light emission by the semiconductor light emitting device 110 is improved. Also, the sheet resistance of the second electrode layer 20 is preferably not more than 10 Ω/square, and more preferably not more than 5 Ω/square. Lowering the sheet resistance markedly improves uniform emission and brightness. Also, the heat generated in the semiconductor light emitting device 110 is reduced.

In the semiconductor light emitting device 110 according to the embodiment, a metal layer is formed on the semiconductor layer and the second electrode layer 20 is formed by forming the openings 21 using a later-described method.

Here, setting the thickness of the second electrode layer 20 to be too thin leads to an increase in the resistance value and facilitates the condensation of the Ag in a portion of the second electrode layer 20, and so a thickness of not less than 10 nm is preferable. Conversely, the greater the thickness of the second electrode layer 20 the lower the resistance value. From the point of view of ensuring the transmittance for the light emitted from the light emitting layer 530, a thickness of the second electrode layer 20 is preferably not more than 100 nm, and more preferably not more than 50 nm.

Here, in the second electrode layer 20 the reflectance of the metal material in the bulk state (bulk reflectance) for light of the wavelengths emitted from the light emitting layer 530 is not less than 70%. This is because the low reflectance of the metal causes light losses by converting the light into heat. With the second electrode layer 20, light that could not escape from the device is reflected back by the electrode. Hence, by providing a reflective layer (not illustrated) in a bottom part of the light emitting layer 530, this light can be reused, i.e. extracted to the outside. Thus, the light emitted from the light emitting layer 530 passes through the second electrode layer 20.

Second Embodiment

The following is an explanation of a second embodiment. The second embodiment is a manufacturing method of a semiconductor light emitting device.

Examples of methods for manufacturing a semiconductor light emitting device according to a second embodiment include the methods (A) to (D) described below.

(A) Method Using Electron Beam Lithography

One method of forming the second electrode layer with openings is electron beam lithography. The method using electron beam lithography for manufacturing a semiconductor light emitting device according to the second embodiment includes the following processes.

Specifically, the manufacturing method includes: forming a structure on a substrate by epitaxial crystal growth, the structure including a first semiconductor layer of a first conductivity type, a second semiconductor layer of a second conductivity type and a light emitting layer provided between the first semiconductor layer and the second semiconductor layer, and forming a metal layer on the second semiconductor layer (a1); forming a resist film via a transfer layer on the metal layer (a2); forming a resist mask pattern having a plurality of first resist openings by irradiating the resist film with an electron beam and developing and forming second openings in the transfer layer using the resist mask pattern (a3); forming a second electrode layer having a plurality of openings by etching the metal layer using the resist mask pattern and the transfer mask pattern (a4); forming an inorganic film, which covers a top surface of the metal layer and inner surfaces of the openings, and annealing (a5); and, after separating the substrate from the structure, forming a first electrode layer made of metal on the first semiconductor layer side of the structure, the first electrode layer having a portion contacting the first semiconductor layer (a6).

Also, in the embodiment, the forming of the second electrode layer (a4) includes forming the plurality of openings, each of which has an equivalent circle diameter of not less than 10 nm and not more than 5 μm.

Specifically, the semiconductor light emitting device is, for example, manufactured as follows.

FIGS. 5A to 5D are schematic cross-sectional views illustrating an exemplary process of the method using electron beam lithography.

Figure 5A:
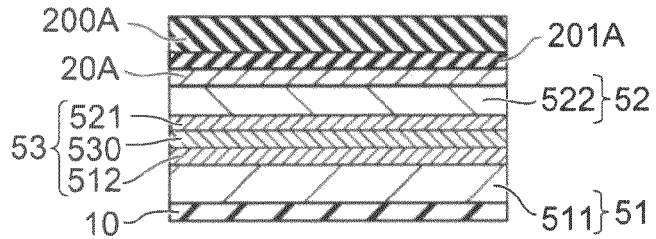
FIGS. 5A to 8H are schematic cross-sectional views illustrating methods of manufacturing the semiconductor light emitting device according to the embodiment.

First, as illustrated in FIG. 5A, the first semiconductor layer 51 is formed on a substrate 10, the light emitting layer 530 is formed on the first semiconductor layer 51, and the second semiconductor layer 52 is formed on the light emitting layer 530.

Next, the metal layer 20A is formed on the second semiconductor layer 52. Next, a silicon oxide film 201A is deposited as the transfer layer using, for example, electron beam (EB) deposition. Then, a resist film 200A for the electron beam lithography is formed on the metal layer 20A.

Figure 5B:
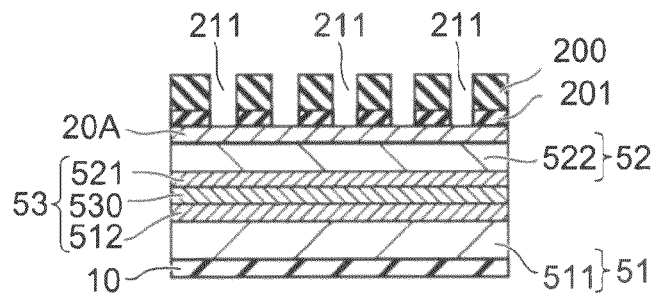

Next, as illustrated in FIG. 5B, resist openings 211 corresponding to the openings 21 are formed in the resist film 200A using an electron beam exposure apparatus equipped with a pattern generator.

Figure 5C:
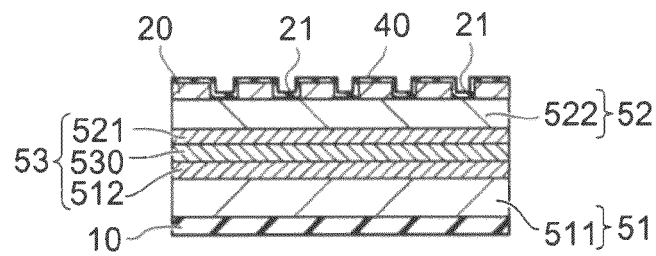

Next, the resist mask pattern 200 with the resist openings 211 formed therein is transferred to the silicon oxide film 201A, which is the transfer layer, using Reactive Ion Etching (RIE). Next, with the silicon oxide mask pattern 201 that includes openings, the metal layer 20A is etched by ion milling. As a result, the openings 21 that correspond to resist openings 211 are formed in the metal layer 20A (FIG. 5C). The metal layer 20A in which the openings 21 are formed becomes the second electrode layer 20. After etching the metal layer 20A, the resist mask pattern 200 and the silicon oxide mask pattern 201 is removed. After forming the second electrode layer 20, the inorganic film 40 is formed by, for example, Chemical Vapor Deposition (CVD). Thereafter, to ensure a sufficient ohmic contact between the second electrode layer 20 and the second semiconductor layer 52, annealing is performed for a predetermined period at a temperature of, for example, 650° C.

Figure 5D:
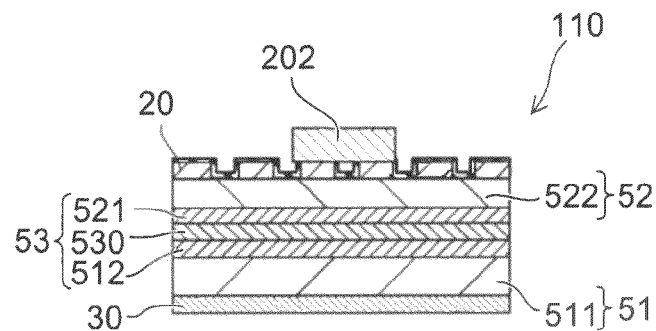

Thereafter, as illustrated in FIG. 5D, a pad electrode 202 is formed on the metal layer 20A. Then, the substrate 10 is separated from a bottom surface of the first semiconductor layer 51, and the first electrode layer 30 is formed on the bottom surface of the first semiconductor layer 51.

For example, an electrode-protecting resin is coated on the second electrode layer 20 side, which is the top surface, and a reinforcing substrate is adhered.

Thereafter, the epitaxial layers are separated from the sapphire substrate using a Laser Lift-Off (LLO) method in which the arrangement is irradiated with Krypton Fluoride (KrF) excimer laser light with a wavelength of 248 nm from the sapphire substrate side and a boundary region of the sapphire substrate and GaN absorbs the laser light. The gallium remaining on the back surface is removed by a hydrochloric acid treatment.

Next, Ag thin film is deposited on the separated back surface by sputtering and then Ag electrode layer with a thickness of 50 μm is formed by plating.

The reinforcing substrate is removed by dissolving the resin of the top surface using an organic solvent. Lastly, the devices are divided by dicing to complete the semiconductor light emitting device 110.

(B) Method Using a Stamper

Another method for manufacturing a semiconductor light emitting device according to this embodiment is to use a stamper. The method includes the following processes.

Specifically, the manufacturing method includes: forming a structure on a substrate by epitaxial crystal growth, the structure including a first semiconductor layer of a first conductivity type, a second semiconductor layer of a second conductivity type and a light emitting layer provided between the first semiconductor layer and the second semiconductor layer, and forming a metal layer on the second semiconductor layer (b1); forming a resist film on the metal layer (b2); pressing the resist film with protrusions of a stamper including protrusions to form a resist mask pattern having a plurality of resist recesses (b3); etching the metal layer using the resist mask pattern to form a second electrode layer having a plurality of openings corresponding to the resist recesses (b4), forming an inorganic film, which covers a top surface of the metal layer and inner surfaces of the openings, and annealing (b5); and, after separating the substrate from the structure, forming a first electrode layer made of metal on the first semiconductor layer side of the structure, the first electrode layer having a portion contacting the first semiconductor layer.

Also, in the embodiment, the forming of the second electrode layer (b4) includes forming the plurality of openings each of which has an equivalent circle diameter of not less than 10 nm and not more than 5 μm.

Specifically, the semiconductor light emitting device can be obtained as follows, for example.

FIGS. 6A to 6F are schematic cross-sectional views illustrating an exemplary process of the method using the stamper.

Figure 6A:
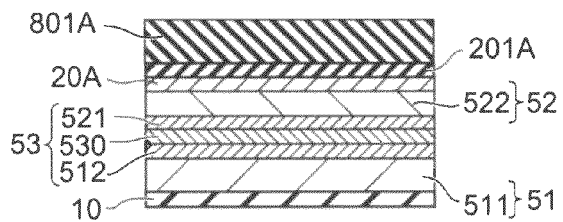

First, as illustrated in FIG. 6A, the first semiconductor layer 51 is formed on the substrate 10, the light emitting layer 530 is formed on the first semiconductor layer 51, and the second semiconductor layer 52 is formed on the light emitting layer 530.

Next, the metal layer 20A is formed on the second semiconductor layer 52. Then, silicon oxide film 201A is formed by the EB deposition, for example as the transfer film on the metal layer 20A. Further, a resist film 801A is formed on the silicon oxide film 201A.

Figure 6E:
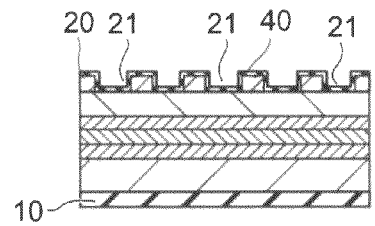
Figure 6B:
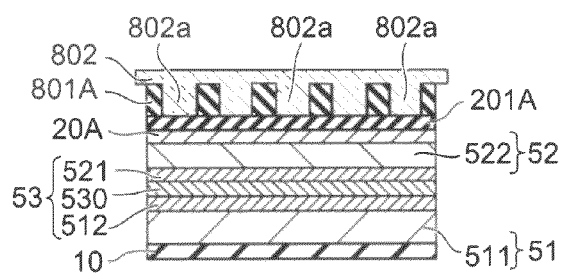

Next, a stamper 802 is prepared having protrusions 802a as illustrated in FIG. 6B.

For example, a plurality of the protrusions 802a are provided in a transfer face of the stamper 802.

The stamper 802 can be manufactured by forming a desired structure using electron beam lithography. Note that the method for forming the stamper 802 including a microstructure of recesses and protrusions is not limited to this method. For example, the stamper 802 can be formed by later-described methods using self-assembly with a block copolymer or a method using a microparticle mask.

Next, as illustrated in FIG. 6B, the transfer face of the stamper 802 having the protrusions is contacted to and pressed into the resist film 801A to perform imprinting, while the resist film 801A is heated to a predetermined temperature if necessary. After imprinting, the resist film 801A is cured while cooling it down to room temperature, and the stamper 802 is released. In this way, a resist pattern 801B is formed having recesses corresponding to the protrusions 802a, as illustrated in FIG. 6C. The above has described an example of thermal imprinting, but UV imprinting may also be used.

Figure 6F:
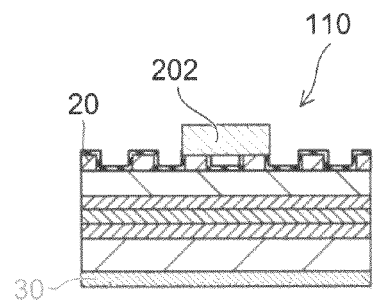
Figure 6C:
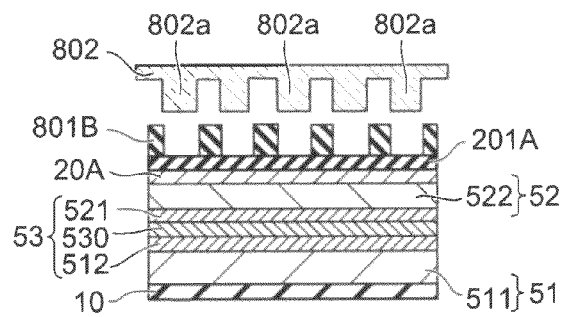
Figure 6D:
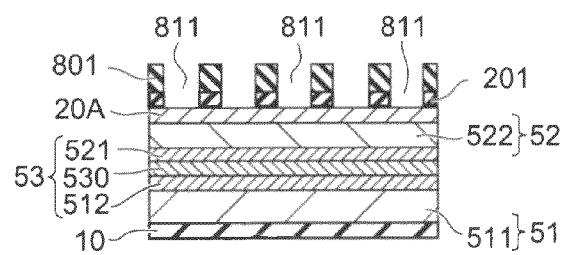

Next, as illustrated in FIG. 6D, the resist pattern 801B is etched. With the etching, the resist film is partially removed, and the metal layer 20A is exposed in the bottoms of the recesses (FIG. 6D). The portions where the metal layer 20A is exposed become resist openings 811. Next, the resist mask pattern 801 including the resist opening 811 is transferred by Reactive Ion Etching (RIE) to the silicon oxide film 201A of the transfer layer.

Next, the metal layer 20A is etched by ion milling using the silicon oxide mask pattern 201 in which the resist openings 811 have been transferred. As a result, the openings 21 that correspond to the resist openings 811 are formed in the metal layer 20A (FIG. 6E). The metal layer 20A in which the openings 21 are formed becomes the second electrode layer 20. After etching the metal layer 20A, the resist mask pattern 801 and the silicon oxide mask pattern 201 are removed. After forming the second electrode layer 20, the inorganic film 40 is formed by CVD method, for example. Thereafter, to ensure a sufficient ohmic contact between the second electrode layer 20 and the second semiconductor layer 52, annealing is performed for a predetermined period at a temperature of 650° C.

Thereafter, as illustrated in FIG. 6F, a pad electrode 202 is formed on the metal layer 20A. Then, the substrate 10 is separated from a bottom surface of the first semiconductor layer 51, and the first electrode layer 30 is formed on the bottom surface of the first semiconductor layer 51.

For example, an electrode-protecting resin is coated on the second electrode layer 20 side, which is the top surface, and a reinforcing substrate is adhered.

Thereafter, the epitaxial layers are separated from the sapphire substrate using a Laser Lift-Off (LLO) method in which the arrangement is irradiated with KrF excimer laser light with a wavelength of 248 nm from the sapphire substrate side and a boundary region of the sapphire substrate and GaN absorbs the laser light. The gallium remaining on the back surface is removed by a hydrochloric acid treatment.

Next, an Ag thin film is deposited on the separated back surface by sputtering and then an Ag electrode layer with a thickness of 50 μm is formed by plating.

The reinforcing substrate is removed by dissolving the resin of the top surface using an organic solvent. Lastly, the devices are divided by dicing to complete the semiconductor light emitting device 110.

The method of using a stamper is not limited to the heat forming as described above, and various technologies may be used, such as forming by hardening the resist with light irradiation. Furthermore, a stamper made of flexible material such as poly dimethylacrylamide (PDMA), poly dimethylsiloxane (PDMS) or the like can be used.

(C) Method Using the Self-Assembling of Block Copolymers

One other method for manufacturing a semiconductor light emitting device according to the second embodiment is to use phase separation by the self-assembling of block copolymers. The method includes the following processes.

Specifically, the manufacturing method includes: forming a structure on a substrate by epitaxial crystal growth, the structure including a first semiconductor layer of a first conductivity type, a second semiconductor layer of a second conductivity type and a light emitting layer provided between the first semiconductor layer and the second semiconductor layer, and forming a metal layer on the second semiconductor layer (c1); coating a top surface of at least a portion of the metal layer with a composition containing a block copolymer, and generating a microdomain pattern by inducing phase separation in the block copolymer (c2); etching the metal layer with the microdomain mask pattern to form a second electrode layer having a plurality of openings (c3), forming an inorganic film, which covers a top surface of the metal layer and inner surfaces of the openings, and annealing (c4); and, after separating the substrate from the structure, forming a first electrode layer made of metal on the first semiconductor layer side of the structure, a first electrode layer having a portion contacting the first semiconductor layer (c5).

Also, in the embodiment, the forming of the second electrode layer (c3) includes forming the plurality of openings, each of which has an equivalent circle diameter of not less than 10 nm and not more than 5 μm.

Specifically, the semiconductor light emitting device can be obtained as follows, for example.

FIGS. 7A to 7F are schematic cross-sectional views illustrating an exemplary process of the method using the self-assembling of block copolymers.

Figure 7A:
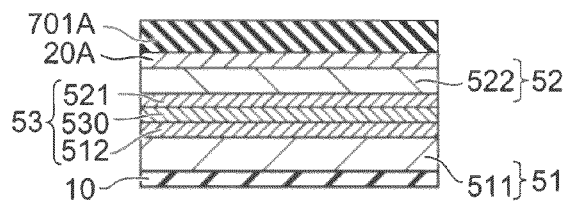

First, as illustrated in FIG. 7A, the first semiconductor layer 51 is formed on a substrate 10, the light emitting layer 530 is formed on the first semiconductor layer 51, and the second semiconductor layer 52 is formed on the light emitting layer 530.

Next, a metal layer 20A is formed on the second semiconductor layer 52. Then, silicon oxide film 701A is formed on the metal layer 20A.

Figure 7E:
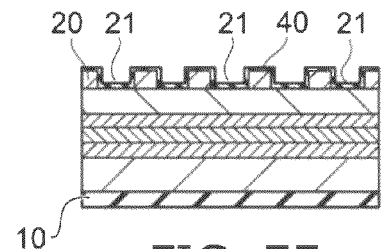
Figure 7B:
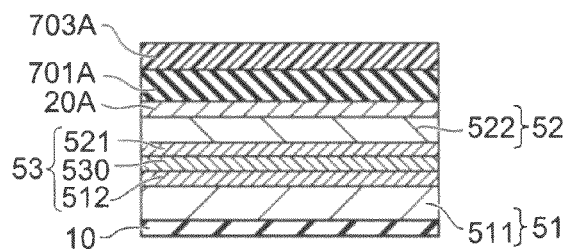

Next, as illustrated in FIG. 7B, a solvent in which block copolymers having two types of polymer block are dissolved is applied on the silicon oxide film 701A by the spin coating method. Thereafter, pre-baking is carried out to remove the solvent and to form a block copolymer film 703A. Then, the film is annealed, inducing microphase separation of the two types of polymer, i.e. a microdomain 703 is formed in the block copolymer film 703A (FIG. 7C).

Next, the microdomain 703 is etched using, for example, an RIE apparatus. Here, due to the difference in the etching rates of the two types of polymer, the microdomain 703 with the faster etching rate is removed and a hole pattern is formed.

Figure 7F:
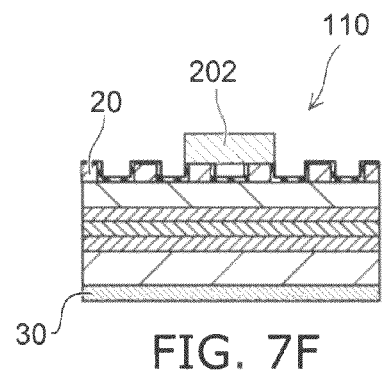
Figure 7C:
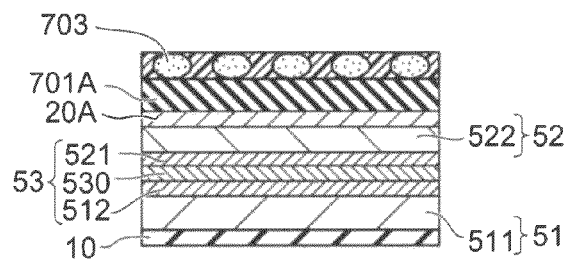
Figure 7D:
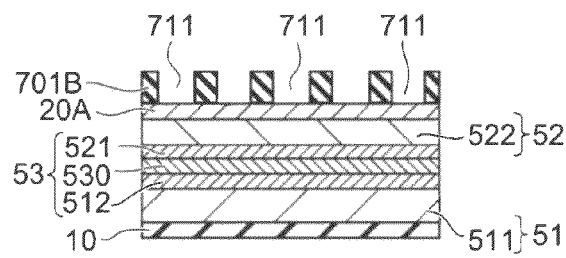

Next, the silicon oxide film 701A is etched using, for example, an RIE apparatus, and the hole pattern is transferred to be an oxide film mask pattern 701B (FIG. 7D). The oxide film mask pattern 701B has a hole pattern 711 corresponding to the hole pattern in the block copolymer film 703A.

Next, the metal layer 20A is etched by ion milling with the oxide film mask pattern 701B. As a result, the openings 21 that correspond to the hole pattern 711 are formed in the metal layer 20A (FIG. 7E). The metal layer 20A in which the openings 21 are formed becomes the second electrode layer 20. After etching the metal layer 20A, the oxide film mask pattern 701B is removed. After forming the second electrode layer 20, the inorganic film 40 is formed by a CVD method, for example. Thereafter, to ensure a sufficient ohmic contact between the second electrode layer 20 and the second semiconductor layer 52, annealing is performed for a predetermined period at a temperature of 650° C.

Thereafter, as illustrated in FIG. 7F, the pad electrode 202 is formed on the metal layer 20A. Then, the substrate 10 is separated from a bottom surface of the first semiconductor layer 51, and the first electrode layer 30 is formed on the bottom surface of the first semiconductor layer 51.

For example, an electrode-protecting resin is coated on the second electrode layer 20 side, which is the top surface, and a reinforcing substrate is adhered.

Thereafter, the epitaxial layer is separated from the sapphire substrate using a Laser Lift-Off (LLO) method in which the arrangement is irradiated with KrF excimer laser light with a wavelength of 248 nm from the sapphire substrate side and a boundary region of the sapphire substrate and GaN absorbs the laser light. The gallium remaining on the back surface is removed by a hydrochloric acid treatment.

Next, an Ag thin film is deposited on the back surface by sputtering and then an Ag electrode layer with a thickness of 50 μm is formed by plating.

The reinforcing substrate is removed by dissolving the resin of the top surface using an organic solvent. Lastly, the devices are divided by dicing to complete the semiconductor light emitting device 110.

(D) Method Using a Mask Formed of Micro Particles

A further method for manufacturing a semiconductor light emitting device according to the second embodiment is to use a monolayer of microparticles, such as silica particles, as a mask. The method includes the following processes.

Specifically, the manufacturing method includes: forming a structure on a substrate by epitaxial crystal growth, the structure including a first semiconductor layer of a first conductivity type, a second semiconductor layer of a second conductivity type and a light emitting layer provided between the first semiconductor layer and the second semiconductor layer, and forming a metal layer on the second semiconductor layer (d1); forming a resist film on the metal layer (d2); forming a monolayer of microparticles on a top surface of the resist layer (d3); forming openings in the resist film by etching the resist film with the monolayer as a mask (d4); filling the openings of the resist film with an inorganic material to form a reverse mask pattern (d5); forming the second electrode layer having a plurality of openings by etching the metal layer with the reverse mask pattern (d6); forming an inorganic film, which covers a top surface of the metal layer and inner surfaces of the openings, and annealing (d7); and, after separating the substrate from the structure, forming a first electrode layer made of metal on the first semiconductor layer side of the structure, the first electrode layer having a portion contacting the first semiconductor layer (d6).

Also, in the embodiment, the forming of the second electrode layer (d6) includes forming the plurality of openings each of which has an equivalent circle diameter of not less than 10 nm and not more than 5 μm.

Specifically, the semiconductor light emitting device can be obtained as follows, for example.

FIGS. 8A to 8H are schematic cross-sectional views illustrating an exemplary process of the method using microparticles as the mask.

Figure 8A:
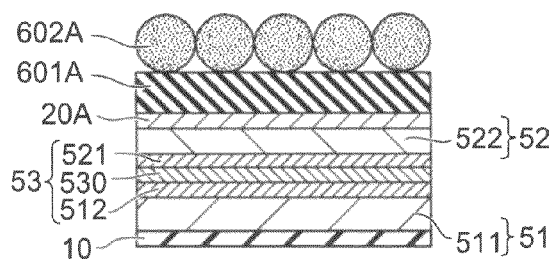

First, as illustrated in FIG. 8A, the first semiconductor layer 51 is formed on a substrate 10, the light emitting layer 530 is formed on the first semiconductor layer 51, and the second semiconductor layer 52 is formed on the light emitting layer 530.

Next, the metal layer 20A is formed on the second semiconductor layer 52. Then, a resist film 601A is formed on the metal layer 20A.

Next, a monomer is added to, for example, solution of ethyl lactate with dispersed silica microparticles to form a slurry. The slurry is dripped onto the resist film 601A and spin coating is performed. After the spin coating, the solution is removed. In this way, a monolayer of microparticles 602A with a regular arrangement is formed.

Figure 8E:
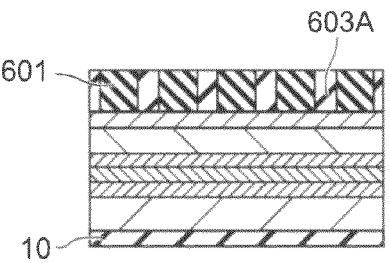
Figure 8B:
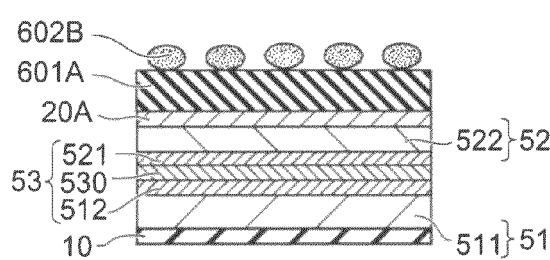
Figure 8F:
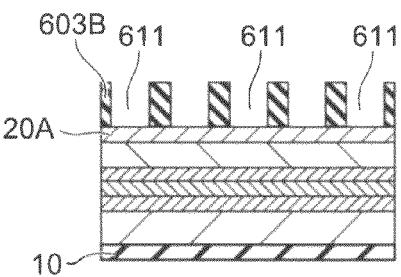

Next, as illustrated in FIG. 8B, the arranged layer of microparticles 602A is etched using an RIE apparatus and the grain size of the microparticles is reduced. Gaps are generated between the reduced-size microparticles 602B.

Figure 8C:
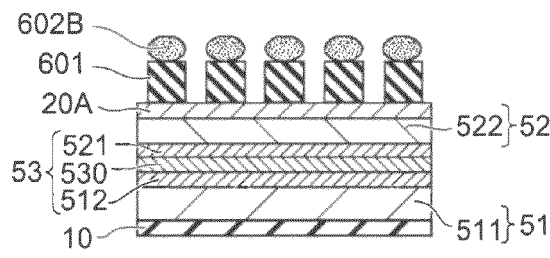

Next, as illustrated in FIG. 8C, the resist film 601A is etched with the microparticles 602B as a mask to form a resist pillar pattern 601.

Figure 8G:
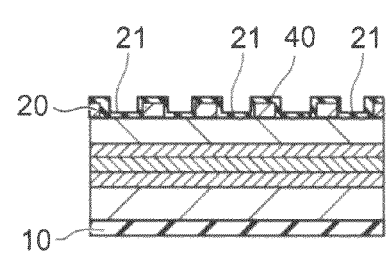
Figure 8D:
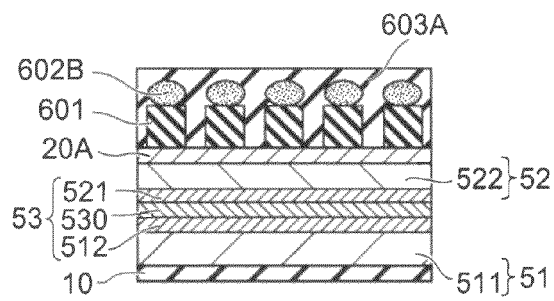

Next, as illustrated in FIG. 8D, an organic SOG composition is dropped and coated on the resist pillar pattern 601 using a spin coating method. After the spin coating, the solution is completely removed and annealing is performed. After the organic SOG composition has hardened, the resist pillar pattern 601 is buried by an SOG layer 603A. The top surface of the SOG layer 603A is then flattened.

Next, as illustrated in FIG. 8E, the SOG layer 603A is etched back to expose the resist pillar pattern 601. Then, the resist pillar pattern 601 is completely removed by etching. After removing the resist pillar pattern 601, an SOG mask pattern 603B is formed, as illustrated in FIG. F. Openings in the mask pattern 603B form an opening pattern 611 that corresponds to the openings 21.

Next, with the SOG mask pattern 603B, the metal layer 20A is etched using ion milling apparatus. As a result, the openings 21 that correspond to the hole pattern 611 are formed in the metal layer 20A (FIG. 8G). The metal layer 20A in which the openings 21 are formed becomes the second electrode layer 20. After the etching of the metal layer 20A, the SOG mask pattern 603B is removed. After forming the second electrode layer 20, the inorganic film 40 is formed by a CVD method, for example. Thereafter, to ensure a sufficient ohmic contact between the second electrode layer 20 and the second semiconductor layer 52, annealing is performed for a predetermined period at a temperature of 650° C.

Figure 8H:
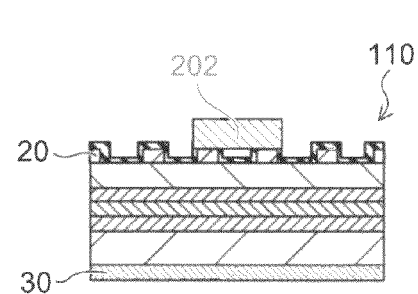

Thereafter, as illustrated in FIG. 8H, a pad electrode 202 is formed on the metal layer 20A. Then, the substrate 10 is separated from a bottom surface of the first semiconductor layer 51, and the first electrode layer 30 is formed on the bottom surface of the first semiconductor layer 51.

For example, an electrode-protecting resin is coated on the second electrode layer 20 side, which is the top surface, and a reinforcing substrate is adhered.

Thereafter, the epitaxial layer is separated from the sapphire substrate using a Laser Lift-Off (LLO) method in which the arrangement is irradiated with KrF excimer laser light with a wavelength of 248 nm from the sapphire substrate side and a boundary region of the sapphire substrate and GaN absorbs the laser light. The gallium remaining on the back surface is removed by a hydrochloric acid treatment.

Next, an Ag thin film is deposited on the back surface by sputtering and then an Ag electrode layer with a thickness of 50 μm is formed by plating.

The reinforcing substrate is removed by dissolving the resin of the top surface using an organic solvent. Lastly, the devices are divided by dicing to complete the semiconductor light emitting device 110.

The above manufacturing methods (A) through (D) are examples, and the embodiment is not limited to these.

Next, examples are explained. The materials, values, manufacturing conditions, and the like indicated in the following examples are examples, and the invention is not limited to these examples.

First Example

In a first example, a semiconductor light emitting device 110 is manufactured in accordance with the method using electron beam lithography as described in (A) above.

First, the GaN current spreading layer 511 is formed on the substrate 10. Next, a heterostructure including the n-type GaN cladding layer 512, the InGaN light emitting layer 530, and the p-type AlGaN cladding layer 521 is formed on the current spreading layer 511. A current spreading layer 522 containing p-type GaN is then epitaxially grown on the heterostructure.

Next, the metal layer 20A made up by the laminated film of Ni (1 nm)/Ag—Pd—Cu (30 nm) is formed by a sputtering method.

Next, a resist film for electrode beam lithography (FEP 301 (trade name) made by FUJIFILM Corp.) with a thickness of 300 nm is formed on the Ag—Pd—Cu layer. Then, a hole pattern (resist openings 211) with opening diameters of 100 nm and distances of 150 nm are formed in the resist film using an electron beam exposure apparatus equipped with a pattern generator and having an acceleration voltage of 50 kV.

Next, openings are formed by carrying out etching for 90 seconds using an ion milling apparatus under the conditions of an acceleration voltage of 500 volts (V) and an ion current of 40 milliamperes (mA). As a result, the second electrode layer 20 having the openings 21 is formed.

Next, the SiN film 40 is formed on the top surface of the metal layer 20A and the inner surfaces of the openings 21 of the second electrode layer 20 using a CVD method. Thereafter, annealing is carried out in a nitrogen atmosphere for 30 minutes at 650° C., to obtain ohmic contact with the metal layer 20A.

Then, a pad electrode 202 is formed on the Ni/Ag—Pd—Cu layer. Then, the substrate 10 is separated from the bottom surface of the current spreading layer 511 and the first electrode layer 30 is formed on the bottom surface of the current spreading layer to complete the semiconductor light emitting device 110.

Second Example

In a second example, the semiconductor light emitting device 110 is manufactured according to the method using the self-assembling of block copolymers as described in (C) above.

First, as in the first example, the current spreading layer 511 of n-type GaN is formed on the substrate 10. Next, the heterostructure including the n-type GaN cladding layer 512, the InGaN light emitting layer 530, and the p-type AlGaN cladding layer 521 is formed on the current spreading layer 511. A current spreading layer 522 containing p-type GaN is then epitaxially grown on the heterostructure.

Next, the metal layer 20A formed from Ni (1 nm)/Ag—Pd—Cu (30 nm) is formed by the sputtering method. Next, a silicon oxide film is formed to a thickness of 50 nm by CVD.

For the block polymer, a block copolymer (PS-b-PMMA) of polystyrene (PS) and polymethyl methacrylate (PMMA) are used. A molecular weight of the block polymer (Mn) is 920 kg/mol and the composition ratio of PS and PMMA is 80 mol:20 mol. Note that, besides PS-b-PMMA, a microdomain pattern may be created using, for example, a block polymer described in the specification of Japanese Patent No. 3940546. The PS-b-PMMA is then dissolved in propylene glycol monomethyl ether acetate (PGMEA) to form a block copolymer resist.

Next, the block copolymer resist is spin-coated onto the silicon oxide film, and annealed at 230° C. in a non-oxidizing oven. As a result, PMMA spherical domains with a diameter of 120 nm are formed in the block copolymer film. A film thickness of the PS-b-PMMA block copolymer is adjusted so that 1 layer of PMMA spherical domains is formed.

PMMA has a low endurance for RIE. Hence, the block copolymer is selectively removed by oxygen RIE etching. In this way, the PMMA domain portions are removed. Then, with the PS that remains in a mesh-like state as the mask, the silicon oxide film is etched using a gas mixture of $CF_4$ and Ar. As a result, an oxide film mask (oxide film mask pattern 701B) having the hole pattern 711 that corresponds to the openings 21 is formed.

Next, the Ag—Pd—Cu layer is etched by an ion milling apparatus using the oxide film mask. As a result, a metal thin film electrode with light transmittivity (the second electrode layer 20) is formed.

After etching the Ni/Ag—Pd—Cu layers, the oxide film mask is removed. Next, the SiN inorganic film 40 is formed on the top surface of the metal layer 20A and the inner surfaces of the openings 21 of the second electrode layer 20. Thereafter, annealing is carried out in a nitrogen atmosphere for 30 minutes at 650° C., to obtain ohmic contact with the metal layer 20A.

Thereafter, a pad electrode 202 is formed on the Ni/Ag—Pd—Cu layer. Then, the substrate 10 is separated from the bottom surface of the current spreading layer 511 and the first electrode layer 30 is formed on the bottom surface of the current spreading layer 511 to complete the semiconductor light emitting device 110.

(First Variation)

Figure 9:
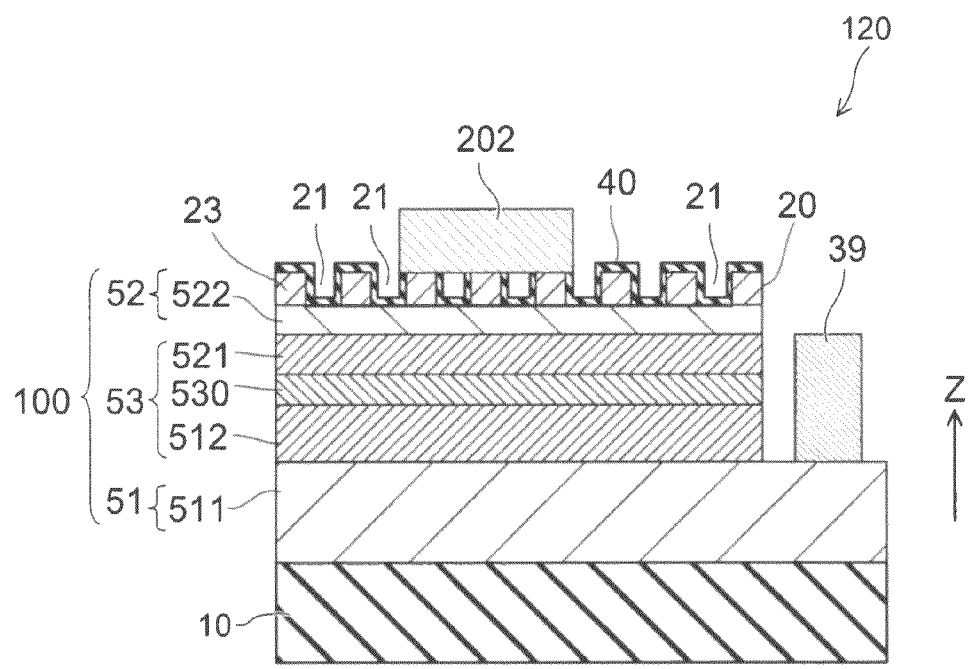
FIG. 9 is a schematic cross-sectional view illustrating a semiconductor light emitting device according to a variation of the embodiment.

FIG. 9 is a schematic cross-sectional view illustrating a semiconductor light emitting device according to a variation.

In the semiconductor light emitting device 120 according to this variation, the structure 100 is formed on the substrate 10. Further, a first electrode layer 39 is provided on an exposed portion on the top surface side of the first semiconductor layer 51.

Specifically, in the semiconductor light emitting device 120, the GaN current spreading layer 511, the n-type GaN cladding layer 512 doped with Si, the light emitting layer 530 having an InGaN/GaN multi quantum well (MQW) structure, the p-type $Al_{0.2}Ga_{0.8}N$ cladding layer 521 doped with Mg, and the p-type GaN current spreading layer 522 doped with Mg are, for example, formed by epitaxial growth on the substrate 10 that is, for instance, a sapphire substrate.

Note that in the semiconductor light emitting device 120 according to this variation, for the sake of convenience, the current spreading layer is included in the first semiconductor layer 51, the current spreading layer 522 is included in the second semiconductor layer 52, and the cladding layer 512, the light emitting layer 530 and the cladding layer 521 are included in the active layer 53.

The second electrode layer 20 having the openings 21 is provided on the current spreading layer 522. Further, portions of the current spreading layer 522, the cladding layer 521, the light emitting layer 530 and the cladding layer 512 are etched, and the first electrode layer 39 is provided on the exposed portion of the current spreading layer 511.

The first electrode layer 39 is not limited to being provided on the back surface side of the first semiconductor layer 51, but may be provided on the top surface side of the first semiconductor layer 51 in the manner of the semiconductor light emitting device 120.

As with the semiconductor light emitting device 110, the semiconductor light emitting device 120 according to this variation makes it possible for light to be emitted efficiently to the outside while the expansion of current to the light emitting layer given by the second electrode layer 20 is maintained.

(Second Variation)

FIGS. 10A to 10E are schematic cross-sectional views illustrating a method for manufacturing the semiconductor light emitting device according to the second variation.

In a semiconductor light emitting device 130 according to the second variation, semiconductors other than nitride semiconductors are used.

Figure 10A:
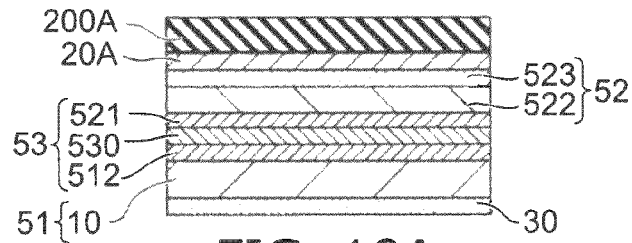
FIGS. 10A to 10E are schematic cross-sectional views illustrating a method of manufacturing the semiconductor light emitting device according to the variation of the embodiment.
Figure 10B:
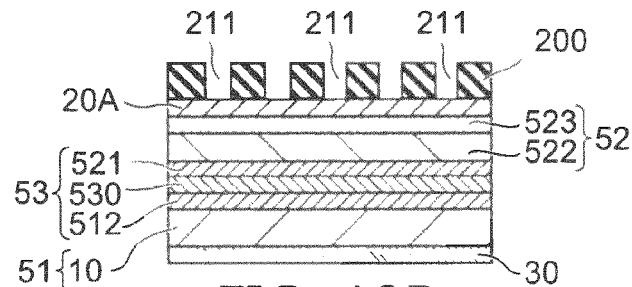
Figure 10C:
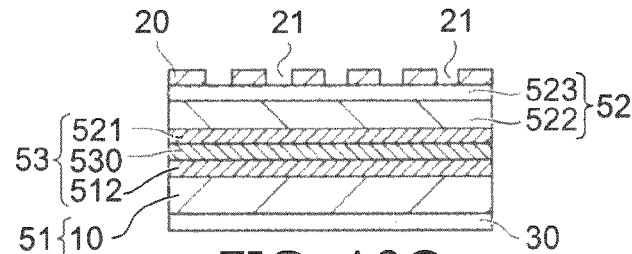

First, as illustrated in FIG. 10A, a heterostructure that includes the n-type InAlP cladding layer 512, the InGaP light emitting layer 530, the p-type InAlP cladding layer 521 or the like is formed on the n-type GaAs growth-use substrate 10. The current spreading layer 522 containing 4 elements, such as p-type InGaAlP is then grown on the heterostructure. In addition, to obtain ohmic contact on the current spreading layer 522, a p-type GaAs contact layer 523 is formed to a thickness of, for example, 0.1 μm. Next, Au or the like is formed as the first electrode layer 30, which is the n-type electrode, on the back surface side of the substrate 10.

Note that in this variation, for sake of convenience, the substrate 10 is included in the first semiconductor layer 51. Moreover, the current spreading layer 522 and the contact layer 523 are included in the second semiconductor layer 52.

Next, the metal layer 20A containing Ag—Cu is formed to a thickness of, for example, 30 nm on the contact layer 523 using the vacuum deposition method.

Next, the resist film 200A for the electron beam lithography (FEP 301 (trade name) made by FUJIFILM Corp.) is formed to thickness of 300 nm on the Ag—Cu metal layer 20A. Then, a hole pattern (resist openings 211) with the equivalent diameters of 100 nm and distances of 200 nm is formed using an electron beam exposure apparatus equipped with a pattern generator and having an acceleration voltage of 50 kV (see FIG. 10B).

Next, openings are formed by etching the Ag—Cu metal layer 20A, with the resist mask pattern 200, using an ion milling apparatus under the conditions of an acceleration voltage of 500 V and an ion current of 40 mA for 90 seconds. As a result, the second electrode layer 20 having the openings 21 is formed (see FIG. 10C).

Figure 10D:
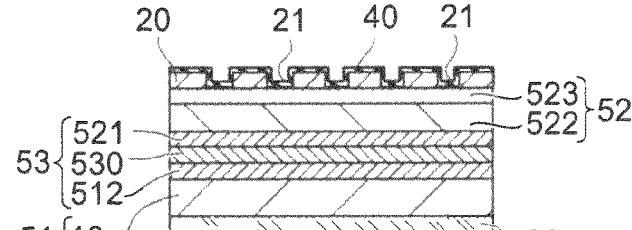

Next, the SiN film 40 is formed on the top surface of the second electrode layer 20 and the inner surfaces of the openings 21 of the Ag—Cu using a CVD method (see FIG. 10D). Then, annealing is carried out in a nitrogen atmosphere for 30 minutes at 550° C. to obtain ohmic contact with the second electrode layer 20.

Figure 10E:
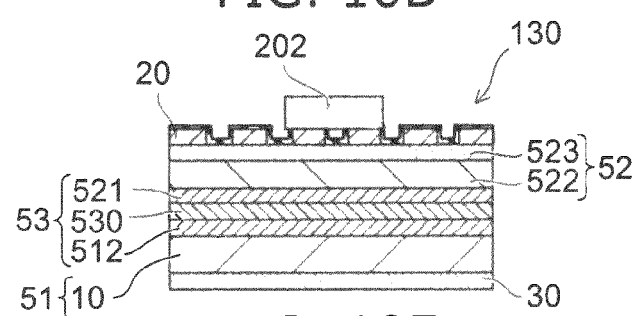

Then, as illustrated in FIG. 10E, the pad electrode 202 is formed on the Ag—Cu second electrode layer 20 to complete the semiconductor light emitting device 130.

The semiconductor light emitting device 130 emits light with, for example, a wavelength of not less than 610 nm and not more than 640 nm. Thus, with the semiconductor light emitting device 130 that includes semiconductors other than nitride semiconductors, the second electrode layer 20 containing Ag can still be used. Hence, as with the semiconductor light emitting device 110, light can be efficiently emitted to the outside while maintaining the current expansion to the light emitting layer 530 given by the second electrode layer 20.

In the above embodiments, note that although examples in which the structure 100 includes nitride semiconductors are described, semiconductor other than a nitride semiconductors may be used. For instance, n-type GaAs may be used as the current spreading layer 511, n-type InAlP used as the cladding layer 512, InGaP as the light emitting layer 530, p-type InAlP as the cladding layer 521 and p-type InGaAlP as the current spreading layer 522.

Moreover, although the first conductivity type was described as being n-type and the second conductivity type as being p-type, implementation is possible with the first conductivity type as p-type and the second conductivity type as n-type.

As described above, the semiconductor light emitting device and the manufacturing method according to the embodiments make it possible to enhance light emission efficiency (light extraction efficiency) and enhance brightness while maintaining uniform current spreading to the semiconductor layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting device comprising:
a structure including a first semiconductor layer of a first conductivity type, a second semiconductor layer of a second conductivity type and a light emitting layer provided between the first semiconductor layer and the second semiconductor layer;
an electrode layer provided on the second semiconductor layer side of the structure, the electrode layer including a metal portion with a thickness of not less than 10 nanometers and not more than 100 nanometers along a direction from the first semiconductor layer toward the second semiconductor layer, and a plurality of openings piercing the metal portion along the direction, each of the openings viewed in the direction having an equivalent circle diameter of not less than 10 nanometers and not more than 5 micrometers, the metal portion including a first layer and a second layer, the first layer containing Ag, the second layer being provided between the first layer and the second semiconductor layer, the second layer containing at least one of Ni, Ti, Cr and Co, the second layer having a thickness of not less than 1 nanometer and not more than 5 nanometers; and
an inorganic film providing on the metal portion and inner surfaces of the openings, the inorganic film having transmittivity with respect to light emitted from the light emitting layer, the inorganic film contains at least one substance selected from the group consisting of SiN, BN, AlN, GaN, Cn, ZnS, $AlF_3$, $MgF_2$, $CaF_2$, $CeF_2$, $GdF_2$, $LaF_2$, $NdF_2$, LiF, NaF, $YbF_3$ and $YF_3$,
the inorganic film covering a first side face of the first layer, the first side face being a part of the inner surfaces of the openings,
the inorganic film covering a second side face of the second layer, the second side face being another part of the inner surfaces of the openings, and
the inorganic film covering a part of the second semiconductor layer located at a bottom of the openings.

2. The semiconductor light emitting device according to claim 1, wherein the first layer contains at least one element selected from the group consisting of Al, Cu, Zn, Zr, Si, Ge, Pt, Rh, Ni, Pd, Cu, Sn, C, Mg, Cr, Te, Se, In, Co and Ti.

3. The semiconductor light emitting device according to claim 1, wherein a thickness of the inorganic film is not less than 20 nanometers and not more than 200 nanometers.

4. The semiconductor light emitting device according to claim 1, wherein the equivalent circle diameter of the openings is not less than 10 nanometers and less than 1 micrometer.

5. The semiconductor light emitting device according to claim 1, wherein the equivalent circle diameter of the openings is not less than 10 nanometers and less than 500 nanometers.

6. The semiconductor light emitting device according to claim 1, wherein the equivalent circle diameter of the openings is not less than 10 nanometers and less than 50 nanometers.

7. The semiconductor light emitting device according to claim 1, wherein an area of the electrode layer viewed in the direction is not less than 1 square millimeter.

8. The semiconductor light emitting device according to claim 1, wherein a sheet resistance of the electrode layer is not more than 10 ohms/square.

9. The semiconductor light emitting device according to claim 1, wherein the equivalent circle diameter of the openings is not more than ½ of a center wavelength of the light emitted by the light emitting layer.

10. The semiconductor light emitting device according to claim 1, wherein a reflectance of a material of the metal portion with respect to a wavelength of the light emitted by the light emitting layer is not less than 70 percent.

11. The semiconductor light emitting device according to claim 1, wherein each of the first semiconductor layer, the second semiconductor layer and the light emitting layer includes a nitride semiconductor.

12. The semiconductor light emitting device according to claim 1, wherein the electrode layer is in ohmic contact with the second semiconductor layer.

* * * * *